United States Patent
Liu et al.

(10) Patent No.: US 9,448,474 B2
(45) Date of Patent: Sep. 20, 2016

(54) POSITIVE PHOTOSENSITIVE RESIN COMPOSITION AND PATTERN FORMING METHOD

(71) Applicant: Chi Mei Corporation, Tainan (TW)

(72) Inventors: Chi-Ming Liu, Kaohsiung (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 14/555,576

(22) Filed: Nov. 27, 2014

(65) Prior Publication Data

US 2015/0160554 A1    Jun. 11, 2015

(30) Foreign Application Priority Data

Dec. 5, 2013 (TW) .............................. 102144704 A

(51) Int. Cl.
*G03F 7/023* (2006.01)
*G03F 7/40* (2006.01)
*G03F 7/039* (2006.01)
*G03F 7/038* (2006.01)

(52) U.S. Cl.
CPC ........... *G03F 7/0233* (2013.01); *G03F 7/0236* (2013.01); *G03F 7/038* (2013.01); *G03F 7/039* (2013.01); *G03F 7/0388* (2013.01); *G03F 7/40* (2013.01)

(58) Field of Classification Search
None
See application file for complete search history.

(56) References Cited

U.S. PATENT DOCUMENTS 6,258,510 B1 * 7/2001 Maemoto ............... G03F 7/029
                                                         430/281.1
6,432,620 B1 * 8/2002 Arao ...................... G03F 7/168
                                                         430/311
2005/0043452 A1   2/2005 Araki
2006/0204730 A1 * 9/2006 Nakamura ........ G02F 1/133512
                                                         428/195.1
2007/0072322 A1 * 3/2007 Chang ................. H01L 27/1214
                                                         438/29
2010/0009482 A1 * 1/2010 Park ..................... G03F 7/0226
                                                         438/34
2010/0220268 A1 * 9/2010 Ohtani ................. C09D 11/322
                                                         349/106

FOREIGN PATENT DOCUMENTS

| JP | 2001183838 | 7/2001 | |
| JP | 2005215035 | 8/2005 | |
| JP | 2010020291 | 1/2010 | |
| JP | 2011253035 | 12/2011 | |
| TW | 583507 | 4/2004 | |
| WO | WO-03/034151 A1 * | 4/2003 | ........... G03F 7/0226 |

OTHER PUBLICATIONS

"Office Action of Taiwan Counterpart Application," issued on Jan. 29, 2015, p. 1-p. 4.

* cited by examiner

*Primary Examiner* — Cynthia Hamilton
(74) *Attorney, Agent, or Firm* — Jianq Chyun IP Office

(57) ABSTRACT

A positive photosensitive resin composition, a pattern forming method, a thin film transistor array substrate, and a liquid crystal display device are provided. The positive photosensitive resin includes a novolac resin (A), an alkali-soluble resin (B), an ester (C) of an o-naphthoquinone diazide sulfonic acid, and a solvent (D). The alkali-soluble resin (B) includes a first alkali-soluble resin (B-1) produced by polymerizing a mixture. The mixture includes an epoxy compound (i) and a compound (ii), wherein the epoxy compound (i) has at least two epoxy groups, and the compound (ii) has at least one carboxylic acid group and at least one ethylenically unsaturated group.

6 Claims, 1 Drawing Sheet

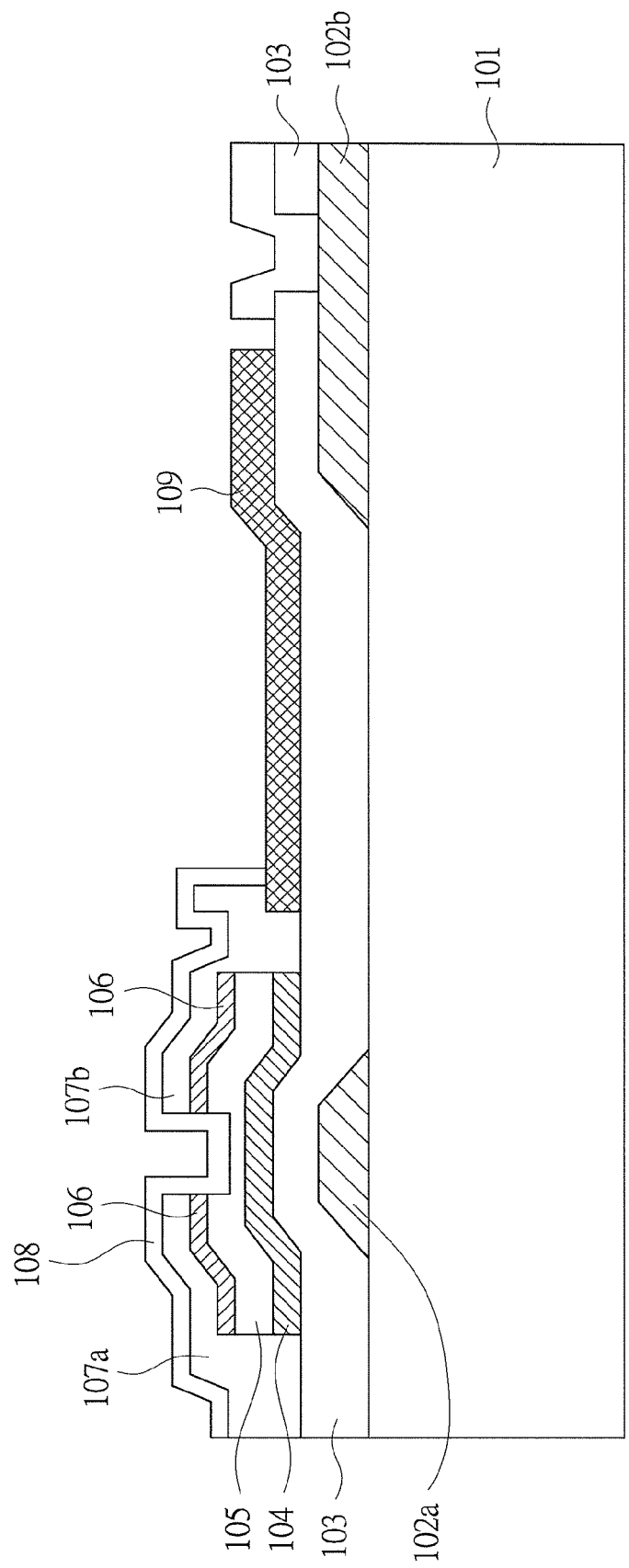

POSITIVE PHOTOSENSITIVE RESIN COMPOSITION AND PATTERN FORMING METHOD

CROSS-REFERENCE TO RELATED APPLICATION

This application claims the priority benefit of Taiwan application serial no. 102144704, filed on Dec. 5, 2013. The entirety of the above-mentioned patent application is hereby incorporated by reference herein and made a part of this specification.

BACKGROUND OF THE INVENTION

1. Field of the Invention

The invention relates to a photosensitive resin composition and applications thereof, and more particularly, to a positive photosensitive resin composition, a pattern forming method, a thin film transistor array substrate, and a liquid crystal display device.

2. Description of Related Art

With the microminiaturization of various electronic devices, various smart phones, thin televisions, and high performance microprocessors have become ubiquitous in the modern daily life. In order to meet the need of various electronic products, the photolithography process has become increasingly sophisticated, and line width formed in the process has also become finer.

In response to the need of various characteristics of a photoresist in the photolithography process, JP 2010-20291A, for instance, discloses a positive photosensitive resin composition. The positive photosensitive resin composition contains an alkali-soluble resin, a quinone diazide compound, a curing agent, and an organic solvent. The alkali-soluble resin can contain an acrylic copolymer and a novolac resin, wherein the acrylic copolymer is prepared by performing a free radical polymerization on an unsaturated olefin compound and a monomer of unsaturated carboxylic acid in the presence of a solvent and a polymerization initiator. The novolac resin is prepared by reacting a phenol compound and an aldehyde or ketone compound in the presence of an acidic catalyst. The heat resistance of the positive photosensitive resin composition can be increased by using the alkali-soluble resin.

Moreover, JP 2001-183838A also discloses a positive photosensitive resin composition. The composition includes a novolac resin, a photo-acid generator, and a cross-linking agent catalyzed by an acid. In JP 2001-183838A, a novolac resin can be synthesized by performing a polycondensation reaction on an alkali-soluble resin, a cresol compound, and/or a xylenol compound in the presence of an acid catalyst, thereby increasing the sensitivity and resolution of the positive photosensitive resin composition.

However, the compositions provided in the patent literatures above are not able to meet the demands of the industry in aspects such as sectional shape and adhesion in development.

Therefore, in order to solve the issues, the development of a photosensitive resin composition material with better performance in at least the aspects of sectional shape and adhesion in development is needed.

SUMMARY OF THE INVENTION

The invention provides a positive photosensitive resin composition for which aspects such as sectional shape and adhesion in development can be sufficiently improved. The invention also provides a pattern forming method applying the positive photosensitive resin composition, a thin film transistor array substrate including a pattern formed by the method, and a liquid crystal display device including the thin film transistor array substrate.

The positive photosensitive resin composition of the invention includes a novolac resin (A), an alkali-soluble resin (B), an ester (C) of an o-naphthoquinone diazide sulfonic acid, and a solvent (D). In particular, the alkali-soluble resin (B) includes a first alkali-soluble resin (B-1) produced by polymerizing a mixture. The mixture contains an epoxy compound (i) and a compound (ii), wherein the epoxy compound (i) has at least two epoxy groups, and the compound (ii) has at least one carboxylic acid group and at least one ethylenically unsaturated group.

In an embodiment of the invention, the epoxy compound (i) can have a structure represented by the following Formula (i-1) or Formula (i-2):

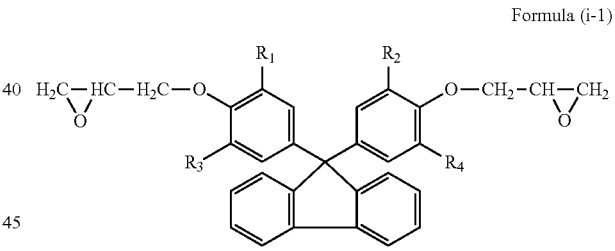

Formula (i-1)

in Formula (i-1), $R_1$, $R_2$, $R_3$, and $R_4$ are respectively the same or different and each represents a hydrogen atom, a halogen atom, an alkyl group having 1 to 5 carbons, an alkoxy group having 1 to 5 carbons, an aryl group having 6 to 12 carbons, or an aralkyl group having 6 to 12 carbons;

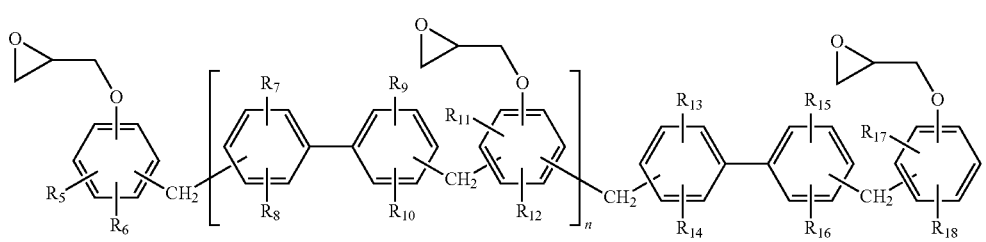

Formula (i-2)

in Formula (i-2), $R_5$ to $R_{18}$ are respectively the same or different and each represents a hydrogen atom, a halogen atom, an alkyl group having 1 to 8 carbons, or an aromatic group having 6 to 15 carbons, and n represents an integer of 0 to 10.

In an embodiment of the invention, the ester (C) of an o-naphthoquinone diazide sulfonic acid is an ester of an o-naphthoquinone diazide sulfonic acid compound and a compound of the following Formula (III):

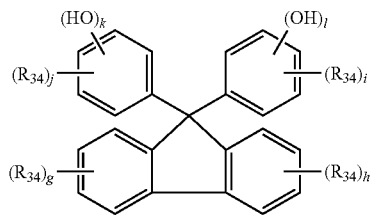

in Formula (III), $R_{34}$ represents hydrogen, an alkyl group, an aryl group, an alkenyl group, or an organic group formed by substituting the above-mentioned group. When a plurality of $R_{34}$ are present, each of $R_{34}$ is respectively the same or different; g, h, i, j are respectively an integer of 0 to 4, and k+l is an integer of 1 to 6.

In an embodiment of the invention, based on 100 parts by weight of the novolac resin (A), the usage quantity of the alkali-soluble resin (B) is, for instance, 5 parts by weight to 50 parts by weight, the usage quantity of the ester (C) of an o-naphthoquinone diazide sulfonic acid is, for instance, 5 parts by weight to 50 parts by weight, and the usage quantity of the solvent (D) is, for instance, 100 parts by weight to 1000 parts by weight; and based on a usage quantity of 100 parts by weight of the alkali-soluble resin (B), the usage quantity of the first alkali-soluble resin (B-1) is 30 parts by weight to 100 parts by weight.

In an embodiment of the invention, the positive photosensitive resin composition can further include a thermal acid generator (E), and the thermal acid generator (E) includes at least one of a sulfonium salt, a benzothiazolium, and a sulfonimide compound.

In an embodiment of the invention, based on 100 parts by weight of the novolac resin (A), the usage quantity of the thermal acid generator (E) is, for instance, 0.01 parts by weight to 0.2 parts by weight.

The invention further provides a pattern forming method including the following steps: the positive photosensitive resin composition above is coated on a substrate, and a pre-bake treatment, an exposure treatment, a development treatment, and a post-bake treatment are performed in sequence, thereby forming a pattern on the substrate.

The invention further provides a thin film transistor array substrate including the pattern formed by the pattern forming method.

Moreover, the invention also provides a liquid crystal display device including the thin film transistor array substrate.

Based on the above, the positive photosensitive resin composition provided in the invention is good in aspects such as sectional shape and adhesion in development, and is suitable for the pattern forming method. A thin film transistor array substrate and a liquid crystal display device for which aspects such as display properties are further improved can also be produced by containing the pattern obtained from the positive photosensitive resin composition.

To make the above features and advantages of the invention more comprehensible, several embodiments are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 illustrates a partial cross-sectional schematic of a TFT array substrate for a liquid crystal display (LCD) device according to an embodiment of the invention.

DESCRIPTION OF THE EMBODIMENTS

The invention provides a positive photosensitive resin composition including a novolac resin (A), an alkali-soluble resin (B), an ester (C) of an o-naphthoquinone diazide sulfonic acid, and a solvent (D).

Hereinafter, more detailed descriptions will respectively be made for the novolac resin (A), the alkali-soluble resin (B), the ester (C) of an o-naphthoquinone diazide sulfonic acid, and the solvent (D). It should be noted that, in the following, groups such as the alkyl group may be further substituted by a substituent. The "number of carbons" of groups such as the alkyl group represents the number of carbons of the entire substituted or unsubstituted group. Furthermore, a group that is not specified as substituted or unsubstituted represents both the substituted and unsubstituted versions of the group.

[Novolac Resin (A)]

The novolac resin (A) used in the invention can be obtained by performing a polycondensation reaction on a cresol aromatic hydroxyl compound and an aldehyde.

Specifically, the cresol aromatic hydroxyl compound is, for instance: a cresol compound such as m-cresol, p-cresol, or o-cresol; or a xylenol compound such as 2,3-dimethylphenol, 2,5-dimethylphenol, 3,5-dimethylphenol, or 3,4-dimethylphenol, but is not limited thereto. Furthermore, the compound can be used alone or as a mixture of two or more.

Without affecting the physical properties of the positive photosensitive resin composition, the novolac resin (A) of the invention can also be obtained by performing a polycondensation reaction on other types of aromatic hydroxyl compounds and an aldehyde compound.

Examples of the other types of aromatic hydroxyl compounds can include, for instance: phenol; an alkyl phenol compound such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, or 6-tert-butyl-3-methylphenol; an alkoxy phenol compound such as p-methoxyphenol, m-methoxyphenol, p-ethoxyphenol, m-ethoxyphenol, p-propoxyphenol, or m-propoxyphenol; an isopropenylphenol compound such as o-isopropenylphenol, p-isopropenylphenol, 2-methyl-4-isopropenylphenol, or 2-ethyl-4-isopropenylphenol; an aryl phenol compound such as phenylphenol; and a polyhydroxyphenol compound such as 4,4'-dihydroxybiphenyl, bisphenol A, resorcinol, hydroquinone, or 1,2,3-pyrogallol, but are not in actuality limited thereto.

Examples of the aldehyde compound reacted in a polycondensation reaction with the cresol aromatic hydroxyl compound can include, for instance: formaldehyde, paraformaldehyde, trioxane, acetaldehyde, propionaldehyde, butyraldehyde, trimethylacetaldehyde, acrolein, crotonaldehyde, cyclohexane aldehyde, furfural, furylacrolein, benzaldehyde, terephthal aldehyde, phenylacetaldehyde, α-phenylpropionaldehyde, β-phenylpropionaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. The aldehyde can also be used alone or as a mixture of two or more. In particular, the aldehyde is preferably formaldehyde.

The novolac resin (A) is preferably produced by the following method: in the presence of an organic acid and/or an inorganic acid catalyst such as hydrochloric acid, sulfuric acid, formic acid, acetic acid, oxalic acid, or p-toluenesulfonic acid, a polycondensation reaction is performed at atmospheric pressure, and an unreacted monomer is removed via dehydration.

[Alkali-Soluble Resin (B)]

The alkali-soluble resin (B) used in the invention contains a first alkali-soluble resin (B-1). The first alkali-soluble resin (B-1) is produced by polymerizing a mixture. The mixture contains an epoxy compound (i) and a compound (ii), the epoxy compound (i) has at least two epoxy groups, and the compound (ii) has at least one carboxylic acid group and at least one ethylenically unsaturated group. Moreover, the mixture can further optionally contain a carboxylic acid anhydride compound (iii) and/or an epoxy group-containing compound (iv).

The epoxy compound (i) has, for instance, a structure represented by the following Formula (i-1) or Formula (i-2). Here, the description of "the epoxy compound (i) can have a structure represented by the following Formula (i-1) or Formula (i-2)" also includes the case in which the compound having the structure represented by the following Formula (i-1) and the compound having the structure represented by the following Formula (i-2) are both present and act as the epoxy compound (i).

Specifically, the epoxy compound (i) having at least two epoxy groups has, for instance, a structure represented by the following Formula (i-1):

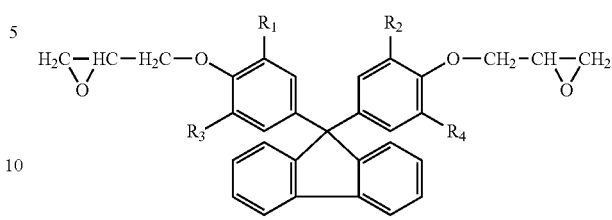

Formula (i-1)

in Formula (i-1), $R_1$, $R_2$, $R_3$, and $R_4$ are respectively the same or different and each represents a hydrogen atom, a halogen atom, an alkyl group having 1 to 5 carbons, an alkoxy group having 1 to 5 carbons, an aryl group having 6 to 12 carbons, or an aralkyl group having 6 to 12 carbons.

The epoxy compound (i) represented by Formula (i-1) can include an epoxy group-containing bisphenol fluorene compound obtained by reacting a bisphenol fluorene compound and an epihalohydrin, but is not limited thereto.

Specific examples of the bisphenol fluorene compound can include, for instance: a compound such as 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, or 9,9-bis(4-hydroxy-3,5-dibromophenyl)fluorene.

The epihalohydrin can include, but is not limited to, for instance, epichlorohydrin or epibromohydrin.

The epoxy group-containing bisphenol fluorene compound obtained by reacting a bisphenol fluorene compound and an epihalohydrin contains, but is not limited to: (1) a product such as ESF-300 manufactured by Nippon Steel Chemical Co., Ltd.; (2) a product such as PG-100 or EG-210 manufactured by Osaka Gas Co., Ltd.; or (3) a product such as SMS-F9PhPG, SMS-F9CrG, or SMS-F914PG manufactured by S.M.S. Technology Co., Ltd.

Moreover, the epoxy compound (i) having at least two epoxy groups can also have a structure represented by the following Formula (i-2):

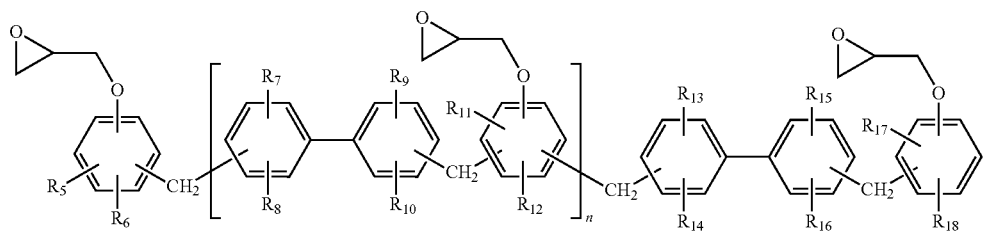

Formula (i-2)

in Formula (i-2), $R_5$ to $R_{18}$ are respectively the same or different and each represents a hydrogen atom, a halogen atom, an alkyl group having 1 to 8 carbons, or an aromatic group having 6 to 15 carbons, and n represents an integer of 0 to 10.

The epoxy compound (i) having at least two epoxy groups of Formula (i-2) is, for instance, obtained by reacting a compound having a structure represented by the following Formula (i-2-1) and an epihalohydrin in the presence of alkali metal hydroxide.

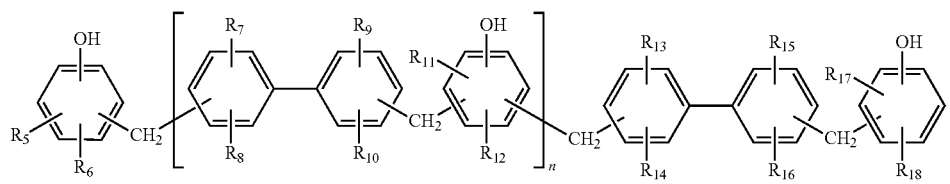

Formula (i-2-1)

In Formula (i-2-1), the definitions of $R_5$ to $R_{18}$ and n are respectively the same as the definitions of $R_5$ to $R_{18}$ and n in Formula (i-2) and are not repeated herein.

Further, the epoxy compound (i) having at least two epoxy groups of Formula (i-2) is formed by, for instance, performing a condensation reaction between a compound having a structure represented by the following Formula (i-2-2) and a phenol to form a compound having the structure represented by Formula (i-2-1) in the presence of an acid catalyst, and then performing a dehydrohalogenation reaction by adding an excess amount of an epihalohydrin to obtain the epoxy compound (i) having at least two epoxy groups represented by Formula (i-2).

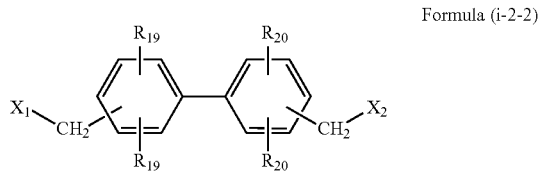

Formula (i-2-2)

In Formula (i-2-2), $R_{19}$ and $R_{20}$ are respectively the same or different and each represents a hydrogen atom, a halogen atom, an alkyl group having 1 to 8 carbons, or an aromatic group having 6 to 15 carbons; $X_1$ and $X_2$ are respectively the same or different and each represents a halogen atom, an alkyl group having 1 to 6 carbons, or an alkoxy group having 1 to 6 carbons. For instance, the halogen atom is preferably chlorine or bromine; the alkyl group is preferably a methyl group, an ethyl group, or a tert-butyl group; and the alkoxy group is preferably a methoxy group or an ethoxy group.

Specific examples of the phenol reacted with the compound having the structure of Formula (i-2-2) can include, for instance: phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethinylphenol, cyclopentylphenol, cyclohexylphenol, and cyclohexylcresol. The phenol can generally be used alone or as a mixture of two or more.

Based on a usage quantity of 1 mole of the compound having the structure of Formula (i-2-2), the usage quantity of the phenol is, for instance, 0.5 moles to 20 moles, preferably 2 moles to 15 moles.

Specific examples of the acid catalyst can include, for instance: hydrochloric acid, sulfuric acid, p-toluenesulfonic acid, oxalic acid, boron trifluoride, aluminium chloride anhydrous, and zinc chloride, wherein p-toluenesulfonic acid, sulfuric acid, and hydrochloric acid are preferred. The acid catalyst can be used alone or as a mixture of two or more.

Further, even though the usage quantity of the acid catalyst is not particularly limited, based on a usage quantity of 100 weight percent (wt %) of the compound having the structure of Formula (i-2-2), the usage quantity of the acid catalyst is preferably 0.1 wt % to 30 wt %.

The condensation reaction can be performed in the absence of a solvent or in the presence of an organic solvent. Further, specific examples of the organic solvent can include, for instance: toluene, xylene, and methyl isobutyl ketone. The organic solvent can be used alone or as a mixture of two or more.

Based on a total usage quantity of 100 wt % of the compound having the structure of Formula (i-2-2) and the phenol, the usage quantity of the organic solvent is 50 wt % to 300 wt %, wherein 100 wt % to 250 wt % is preferred. Moreover, the operating temperature of the condensation reaction is 40° C. to 180° C., and the operating time of the condensation reaction is 1 hour to 8 hours.

After the condensation reaction is completed, a neutralization treatment or a rinse treatment can be performed. The neutralization treatment, for instance, adjusts the pH value of the reacted solution to pH 3 to pH 7, preferably to pH 5 to pH 7. The rinse treatment can be performed by using a neutralizing agent. The neutralizing agent is a basic material, and specific examples of the neutralizing agent can include, for instance: an alkali metal hydroxide such as sodium hydroxide or potassium hydroxide; an alkaline earth metal hydroxide such as calcium hydroxide or magnesium hydroxide; an organic amine such as diethylene triamine, triethylenetetramine, aniline, or phenylene diamine; and ammonia and sodium dihydrogen phosphate. The rinse treatment can be performed with a known method, such as by adding an aqueous solution containing a neutralizing agent to the reacted solution and then extracting repeatedly. After the neutralization treatment or the rinse treatment, the unreacted phenol and solvent are distilled by a heat treatment under reduced pressure, and then the reacted solution is condensed to obtain the compound having the structure of Formula (i-2-1).

Specific examples of the epihalohydrin can include, for instance: 3-chloro-1,2-epoxypropane, 3-bromo-1,2-epoxypropane, and any combination thereof. Moreover, before the dehydrohalogenation reaction is performed, an alkali metal hydroxide such as sodium hydroxide or potassium hydroxide can be added prior to or during the reaction. The operating temperature of the dehydrohalogenation reaction is, for instance, 20° C. to 120° C. and the operating time thereof ranges from, for instance, 1 hour to 10 hours.

In a specific embodiment of the invention, as the alkali metal hydroxide added in the dehydrohalogenation reaction, an aqueous solution thereof can also be used. For instance, when the aqueous solution of the alkali metal hydroxide is continuously added to the dehydrohalogenation reaction system, water and epihalohydrin can be continuously distilled at the same time at reduced pressure or atmospheric pressure, thereby separating and removing water, and epihalohydrin can continuously flow back to the reaction system at the same time.

Moreover, before the dehydrohalogenation reaction is performed, a quaternary ammonium salt such as tetramethyl ammonium chloride, tetramethyl ammonium bromide, or trimethyl benzyl ammonium chloride can also be added as a catalyst. After the reaction is performed at 50° C. to 150° C. for 1 hour to 5 hours, the alkali metal hydroxide or an aqueous solution thereof is added to react for 1 hour to 10 hours at a temperature of 20° C. to 120° C. to perform the dehydrohalogenation reaction.

Based on a total of 1 equivalent of the hydroxyl group in the compound having the structure of Formula (i-2-1), the usage quantity of the epihalohydrin can be 1 equivalent to 20 equivalents, preferably 2 equivalents to 10 equivalents. Based on a total of 1 equivalent of the hydroxyl group in the compound having the structure of Formula (i-2-1), the usage quantity of the alkali metal hydroxide added in the dehydrohalogenation reaction can be 0.8 equivalents to 15 equivalents, preferably 0.9 equivalents to 11 equivalents.

Additionally, in order to facilitate the dehydrohalogenation reaction, in addition to add an alcohol such as methanol or ethanol, an aprotic polar solvent such as dimethyl sulfone or dimethyl sulfoxide can also be added to perform the reaction. When an alcohol is used, based on a total amount of 100 wt % of the epihalohydrin, the usage quantity of the alcohol can be 2 wt % to 20 wt %, preferably 4 wt % to 15 wt %. In an embodiment of using an aprotic polar solvent, based on a total amount of 100 wt % of the epihalohydrin, the usage quantity of the aprotic polar solvent can be 5 wt % to 100 wt %, preferably 10 wt % to 90 wt %.

After the dehydrohalogenation reaction is completed, a rinse treatment can be optionally performed. Then the epihalohydrin, the alcohol, and the aprotic polar solvent, etc. are removed by heating under reduced pressure. The heating under reduced pressure is performed, for instance, at a temperature of 110° C. to 250° C. and a pressure equal to or less than 1.3 kPa (10 mmHg), but is not in actuality limited thereto.

In order to prevent the epoxy resin formed from containing a hydrolysable halogen, the solution after the dehydrohalogenation reaction can be added with a solvent such as toluene or methyl isobutyl ketone, and an aqueous solution of an alkali metal hydroxide such as sodium hydroxide or potassium hydroxide can be added to perform the dehydrohalogenation reaction again. In the dehydrohalogenation reaction, based on a total of 1 equivalent of the hydroxyl group in the compound having the structure of Formula (i-2-1), the usage quantity of the alkali metal hydroxide is 0.01 moles to 0.3 moles, preferably 0.05 moles to 0.2 moles. Further, the operating temperature of the dehydrohalogenation reaction ranges from 50° C. to 120° C. and the operating time thereof ranges from 0.5 hours to 2 hours.

After the dehydrohalogenation reaction is completed, the salt is removed by steps such as filtration and washing. Additionally, solvents such as toluene and methyl isobutyl ketone can be distilled by heating under reduced pressure to obtain the epoxy compound (i) having at least two epoxy groups represented by Formula (i-2). The epoxy compound (i) having at least two epoxy groups of Formula (i-2) can contain, but is not limited to, a product manufactured by Nippon Kayaku Co. Ltd. such as NC-3000, NC-3000H, NC-3000S, or NC-3000P.

The compound (ii) having at least one carboxylic acid group and at least one ethylenically unsaturated group is, for instance, selected from the group consisting of the following (1) to (3): (1) acrylic acid, methacrylic acid, 2-methacryloyloxyethylbutanedioic acid, 2-methacryloyloxybutylbutanedioic acid, 2-methacryloyloxyethylhexanedioic acid, 2-methacryloyloxybutylhexanedioic acid, 2-methacryloyloxyethylhexahydrophthalic acid, 2-methacryloyloxyethylmaleic acid, 2-methacryloyloxypropylmaleic acid, 2-methacryloyloxybutylmaleic acid, 2-methacryloyloxypropylbutanedioic acid, 2-methacryloyloxypropylhexanedioic acid, 2-methacryloyloxypropyltetrahydrophthalic acid, 2-methacryloyloxypropylphthalic acid, 2-methacryloyloxybutylphthalic acid, and 2-methacryloyloxybutylhydrophthalic acid; (2) a compound obtained by reacting a hydroxyl group-containing (meth)acrylate and a dicarboxylic acid compound, wherein the dicarboxylic acid compound contains, but is not limited to, hexanedioic acid, butanedioic acid, maleic acid, or phthalic acid; and (3) a hemiester compound obtained by reacting a hydroxyl group-containing (meth)acrylate and a carboxylic acid anhydride compound (iii), wherein the hydroxyl group-containing (meth)acrylate contains, but is not limited to, (2-hydroxyethyl) acrylate, (2-hydroxyethyl) methacrylate, (2-hydroxypropyl) acrylate, (2-hydroxypropyl) methacrylate, (4-hydroxybutyl) acrylate, (4-hydroxybutyl) methacrylate, or pentaerythritol tri(meth)acrylate. Further, the carboxylic acid anhydride compound can be the same as the carboxylic acid anhydride compound (iii) contained in the mixture of a first alkali-soluble resin (B-1) described below and is not repeated herein.

The mixture of the first alkali-soluble resin (B-1) can further optionally contain the carboxylic acid anhydride compound (iii) and/or the epoxy group-containing compound (iv). The carboxylic acid anhydride compound (iii) can be selected from the group consisting of the following (1) to (2): (1) a dicarboxylic anhydride compound such as butanedioic anhydride, maleic anhydride, itaconic anhydride, phthalic anhydride, tetrahydrophthalic anhydride, hexahydrophthalic anhydride, methyl tetrahydrophthalic anhydride, methylhexahydrophthalic anhydride, methyl endo-methylene tetrahydro phthalic anhydride, chlorendic anhydride, glutaric anhydride, or 1,3-dioxoisobenzofuran-5-carboxylic anhydride; and (2) a tetracarboxylic anhydride compound such as benzophenone tetracarboxylic dianhydride (BTDA for short), biphenyl tetracarboxylic dianhydride, or diphenyl ether tetracarboxylic acid dianhydride.

The epoxy group-containing compound (iv) is, for instance, selected from the group consisting of glycidyl methacrylate, 3,4-epoxy cyclohexyl methacrylate, an unsaturated group-containing glycidyl ether compound, an epoxy group-containing unsaturated compound, and any combination thereof. The unsaturated group-containing glycidyl ether compound contains, but is not limited to, a compound such as Denacol EX-111, Denacol EX-121, Denacol EX-141, Denacol EX-145, Denacol EX-146, Denacol EX-171, or Denacol EX-192 (products of Nagase Kasei Kogyo Co., Ltd.)

The first alkali-soluble resin (B-1) can be obtained by polymerizing the epoxy compound (i) having at least two epoxy groups of Formula (i-1) and the compound (ii) having at least one carboxylic acid group and at least one ethylenically unsaturated group to form a hydroxyl group-containing reaction product, and then adding the carboxylic acid anhydride compound (iii) to perform a reaction. Based on a total of 1 equivalent of the hydroxyl group in the hydroxyl group-containing reaction product, the equivalent of the acid anhydride group contained in the carboxylic acid anhydride compound (iii) is preferably 0.4 equivalents to 1 equivalent, more preferably 0.75 equivalents to 1 equivalent. When a plurality of the carboxylic acid anhydride compounds (iii) are used, the plurality of the carboxylic acid anhydride compounds (iii) can be added in the reaction in sequence or at the same time. When a dicarboxylic acid anhydride compound and a tetracarboxylic acid anhydride compound are used as the carboxylic acid anhydride compound (iii), the molar ratio of the dicarboxylic acid anhydride compound and the tetracarboxylic acid anhydride compound is preferably 1/99 to 90/10, more preferably 5/95 to 80/20. Further, the operating temperature of the reaction ranges from, for instance, 50° C. to 130° C.

The first alkali-soluble resin (B-1) can be produced by reacting the epoxy compound (i) having at least two epoxy groups of Formula (i-2) and the compound (ii) having at least one carboxylic acid group and at least one ethylenically unsaturated group to form a hydroxyl group-containing reaction product, and then performing a polymerization reaction by adding the carboxylic acid anhydride compound (iii) and/or the epoxy-group containing compound (iv). Based on a total of 1 equivalent of the epoxy group of the epoxy compound (i) having at least two epoxy groups of Formula (i-2), the acid value equivalent of the compound (ii) having at least one carboxylic acid group and at least one ethylenically unsaturated group is preferably 0.8 equivalents to 1.5 equivalents, more preferably 0.9 equivalents to 1.1 equivalents. Based on a total amount of 100 mol % of the hydroxyl group in the hydroxyl group-containing reaction product, the usage quantity of the carboxylic acid anhydride compound (iii) is preferably 10 mol % to 100 mol %, more preferably 20 mol % to 100 mol %, and even more preferably 30 mol % to 100 mol %.

When preparing the first alkali-soluble resin (B-1), a basic compound is generally added in the reaction solution as a reaction catalyst to accelerate the reaction. The reaction catalyst can be used alone or as a mixture, and the reaction catalyst contains, but is not limited to, for instance: triphenyl phosphine, triphenyl stibine, triethylamine, triethanolamine, tetramethylammonium chloride, or benzyltriethylammonium chloride. Based on a total usage quantity of 100 parts by weight of the epoxy compound (i) having at least two epoxy groups and the compound (ii) having at least one carboxylic acid group and at least one ethylenically unsaturated group, the usage quantity of the reaction catalyst is preferably 0.01 parts by weight to 10 parts by weight, more preferably 0.3 parts by weight to 5 parts by weight.

Additionally, to control the degree of polymerization, a polymerization inhibitor is generally added in the reaction solution. The polymerization inhibitor can contain, but is not limited to, for instance: methoxyphenol, methylhydroquinone, hydroquinone, 2,6-di-t-butyl-p-cresol, or phenothiazine. Generally, the polymerization inhibitor can be used alone or as a mixture of two or more. Based on a total usage quantity of 100 parts by weight of the epoxy compound (i) having at least two epoxy groups and the compound (ii) having at least one carboxylic acid group and at least one ethylenically unsaturated group, the usage quantity of the polymerization inhibitor is preferably 0.01 parts by weight to 10 parts by weight, more preferably 0.1 parts by weight to 5 parts by weight.

When preparing the first alkali-soluble resin (B-1), a polymerization solvent can be used if needed. Specific examples of the polymerization solvent can include, for instance, an alcohol compound such as ethanol, propanol, iso-propanol, butanol, iso-butanol, 2-butanol, hexanol, or ethylene glycol; a ketone compound such as methyl ethyl ketone or cyclohexyl ketone; an aromatic hydrocarbon compound such as toluene or xylene; a cellosolve compound such as cellosolve or butyl cellosolve; a carbitol compound such as carbitol or butyl carbitol; a propylene glycol alkyl ether compound such as propylene glycol monomethyl ether; a poly(propylene glycol) alkyl ether compound such as di(propylene glycol) methyl ether; an acetate compound such as ethyl acetate, butyl acetate, ethylene glycol monoethyl ether acetate, or propylene glycol methyl ether acetate; an alkyl lactate compound such as ethyl lactate or butyl lactate; and a dialkyl glycol ether. The polymerization solvent can generally be used alone or as a mixture of two or more. Further, the acid value of the first alkali-soluble resin (B-1) is preferably 50 mgKOH/g to 200 mgKOH/g, more preferably 60 mgKOH/g to 150 mgKOH/g.

Additionally, the number average molecular weight of the first alkali-soluble resin (B-1) measured by gel permeation chromatography (GPC) is, in polystyrene equivalent, preferably 800 to 20,000, more preferably 1,000 to 10,000.

Preferably, the alkali-soluble resin (B) according to the invention further contains a second alkali-soluble resin (B-2). The second alkali-soluble resin (B-2) is obtained by copolymerizing an ethylenically unsaturated monomer containing one or more carboxylic acid groups and other copolymerizable ethylenically unsaturated monomers. Preferably, based on 100 parts by weight of the monomers for copolymerization, the second alkali-soluble resin (B-2) is obtained by copolymerizing 50 parts by weight to 95 parts by weight of the ethylenically unsaturated monomer having one or more carboxylic acid groups and 5 parts by weight to 50 parts by weight of the other copolymerizable ethylenically unsaturated monomers.

The ethylenically unsaturated monomer having one or more carboxylic acid groups can be used alone or as a mixture, and the ethylenically unsaturated monomer having one or more carboxylic acid groups contains, but is not limited to, an unsaturated monocarboxylic acid such as acrylic acid, methacrylic acid (MAA for short), fumaric acid, a-chloroacrylic acid, ethyl acrylic acid, cinnamic acid, 2-acryloyloxyethyl succinate or 2-methacryloyloxyethyl succinate monoester (HOMS for short); an unsaturated dicarboxylic acid (anhydride) such as maleic acid, maleic anhydride, fumaric acid, itaconic acid, itaconic anhydride, citraconic acid, or citraconic anhydride; or an unsaturated polycarboxylic acid (anhydride) having 3 or more carboxylic acid groups. Preferably, the ethylenically unsaturated monomer having one or more carboxylic acid groups is selected from acrylic acid, methacrylic acid, 2-acryloyloxyethyl succinate and 2-methacryloyloxyethyl succinate monoester. More preferably, the ethylenically unsaturated monomer having one or more carboxylic acid groups is selected from 2-acryloyloxyethyl succinate and 2-methacryloyloxyethyl succinate monoester.

The other copolymerizable ethylenically unsaturated monomers can be used alone or as a mixture of two or more, and the other copolymerizable ethylenically unsaturated monomers contain, but are not limited to, an aromatic vinyl compound such as styrene (SM for short), a-methylstyrene, vinyl toluene, p-chlorostyrene, or methoxystyrene; a maleimide such as N-phenylmaleimide (PMI for short), N-o-hydroxyphenyl maleimide, N-m-hydroxyphenyl maleimide, N-p-hydroxyphenyl maleimide, N-o-methylphenyl maleimide, N-m-methylphenyl maleimide, N-p-methylphenyl maleimide, N-o-methoxyphenyl maleimide, N-m-methoxyphenyl maleimide, N-p-methoxyphenyl maleimide, or N-cyclohexylmaleimide; an unsaturated carboxylic acid ester such as methyl acrylate (MA for short), methyl methacrylate, ethyl acrylate, ethyl methacrylate, n-propyl acrylate, n-propyl methacrylate, or iso-propyl acrylate; isopropyl methacrylate; n-butyl acrylate, n-butyl methacrylate, iso-butyl acrylate, iso-butyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, acrylic acid benzyl ester, benzyl methacrylate (BzMA for short), benzyl acrylate, benzyl methacrylate, methoxy triethylene glycol acrylate, methoxy triethylene glycol methacrylate, lauryl methacrylate, tetradecyl methacrylate, cetyl methacrylate, octadecyl methacrylate, eicosyl methacrylate, docosyl methacrylate, or dicyclopentenyloxyethyl acrylate (DCPOA for short); N,N-dimethylaminoethyl acrylate, N,N-dimethylaminoethyl methacrylate, N,N-diethylaminopropyl acrylate, N,N-dimethylaminopropyl methacrylate, N,N-dibutylaminopropyl acrylate, or N-isobutylaminoethyl methacrylate; an unsaturated glycidyl carboxylic acid ester such as glycidyl acrylate or glycidyl methacrylate; a vinyl carboxylic acid ester such as vinyl acetate, vinyl propionate, or vinyl butyrate; an unsaturated ether such as vinyl methyl ether, vinyl ethyl ether, allyl glycidyl ether, or methallyl glycidyl ether; a vinyl cyanide compound such as acrylonitrile, methacrylonitrile, α-chloroacrylonitrile, or vinylidene cyanide; an unsaturated amide such as acrylamide, methacrylamide, α-chloroacrylamide, N-hydroxyethyl acrylamide, or N-hydroxyethyl methacrylamide; or an aliphatic conjugated diene such as 1,3-butadiene, isoprene, or chloroprene.

Preferably, the other copolymerizable ethylenically unsaturated monomers are selected from styrene, N-phenylmaleimide, methyl acrylate, methyl methacrylate, 2-hydroxyethyl acrylate, 2-hydroxyethyl methacrylate, benzyl acrylate, benzyl methacrylate, dicyclopentenyloxyethyl acrylate, and a combination thereof.

When preparing the second alkali-soluble resin (B-2), a solvent can be used; the solvent can be used alone or as a mixture, and the solvent contains, but is not limited to: a (poly)alkylene glycol mono alkyl ether such as ethylene glycol methyl ether, ethylene glycol ethyl ether, diethylene glycol methyl ether, diethylene glycol ethyl ether, diethylene glycol n-propyl ether, diethylene glycol n-butyl ether, triethylene glycol methyl ether, triethylene glycol ethyl ether, propylene glycol methyl ether, propylene glycol ethyl ether, dipropylene glycol monomethyl ether, dipropylene glycol monoethyl ether, dipropylene glycol n-propyl ether, dipropylene glycol n-butyl ether, tripropylene glycol monomethyl ether, or tripropylene glycol monoethyl ether; a (poly) alkylene glycol monoalkyl ether acetate such as ethylene glycol methyl ether acetate, ethylene glycol ethyl ether acetate, propylene glycol methyl ether acetate (PGMEA for short), or propylene glycol ethyl ether acetate; an ether such as diethylene glycol dimethyl ether, diethylene glycol methyl ethyl ether, diethylene glycol diethyl ether, or tetrahydrofuran; a ketone such as methyl ethyl ketone, cyclohexanone, 2-heptanone, or 3-heptanone; an alkyl lactate such as methyl lactate or ethyl lactate; other esters such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate (EEP for short), ethyl ethoxyacetate, ethyl glycolate, methyl 2-hydroxy-3-methylbutanoate, 3-methyl-3-methoxy butyl acetate, 3-methyl-3-methoxy butyl propionate, ethyl acetate, n-propyl acetate, isopropyl acetate, n-butyl acetate, isobutyl acetate, n-pentyl acetate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, or ethyl-2-methoxybutyrate; an aromatic hydrocarbon compound such as toluene or xylene; an amide such as N-methylpyrrolidone, N,N-dimethylformamide, or N,N-dimethylacetamide. Preferably, the solvent is selected from propylene glycol methyl ether acetate, ethyl 3-ethoxypropionate, and a combination thereof. The (poly) alkylene glycol monoalkyl ether refers to an alkylene glycol mono alkyl ether or a polyalkylene glycol monoalkyl ether. The (poly)alkylene glycol monoalkyl ether acetate refers to an alkylene glycol monoalkyl ether acetate or a polyalkylene glycol monoalkyl ether acetate.

The initiator used in the preparation of the second alkali-soluble resin (B-2) is generally a free radical-type polymerization initiator. Specific examples thereof include, for instance, an azo compound such as 2,2'-azobisisobutyronitrile, 2,2'-azobis-(2,4-dimethylvaleronitrile), 2,2'-azobis-(4-methoxy-2,4-dimethylvaleronitrile), or 2,2'-azobis-2-methyl butyronitrile (AMBN for short); and a peroxy compound such as dibenzoyl peroxide.

Additionally, the number average molecular weight of the second alkali-soluble resin (B-2) measured by gel permeation chromatography (GPC) is, in polystyrene equivalent, preferably 3,000 to 30,000, more preferably 5,000 to 25,000.

In a specific embodiment of the invention, the ratio (B-1)/(B-2) of the first alkali-soluble resin (B-1) and the second alkali-soluble resin (B-2) is generally 100/0 to 30/70; preferably 100/0 to 40/60; more preferably 100/0 to 50/50.

Based on a total usage quantity of 100 parts by weight of the alkali-soluble resin (B), the usage quantity of the first alkali-soluble resin (B-1) ranges from 30 parts by weight to 100 parts by weight; preferably from 40 parts by weight to 100 parts by weight; and more preferably from 50 parts by weight to 100 parts by weight.

Based on a total usage quantity of 100 parts by weight of the alkali-soluble resin (B), the usage quantity of the second alkali-soluble resin (B-2) ranges from 0 parts by weight to 70 parts by weight; preferably from 0 parts by weight to 60 parts by weight; and more preferably from 0 parts by weight to 50 parts by weight.

In a specific embodiment of the invention, based on a usage quantity of 100 parts by weight of the novolac resin (A), the usage quantity of the alkali-soluble resin (B) is generally 5 parts by weight to 50 parts by weight, preferably 10 parts by weight to 45 parts by weight, and more preferably 10 parts by weight to 40 parts by weight.

In the case that the novolac resin (A) and the alkali-soluble resin (B) are added, the sectional shape and the adhesion in development of the photosensitive resin composition are both good. If the novolac resin (A) and the alkali-soluble resin (B) are not added to the composition at the same time, then the issues of poor sectional shape and adhesion in development are present in the obtained photosensitive resin composition.

[Ester (C) of an o-Naphthoquinone Diazide Sulfonic Acid]

The ester (C) of an o-naphthoquinone diazide sulfonic acid used in the invention can be selected from a known ester, and is not particularly limited. In a preferred embodiment of the invention, the ester (C) of an o-naphthoquinone diazide sulfonic acid can be an ester of an o-naphthoquinone diazide sulfonic acid compound and a hydroxyl compound, preferably an ester of an o-naphthoquinone diazide sulfonic acid compound and a polyhydroxyl compound, and the ester can be completely esterified or partially esterified.

Specifically, the o-naphthoquinone diazide sulfonic acid compound is, for instance, o-naphthoquinone diazide sulfonic acid or o-naphthoquinone diazide sulfonic acid halogenide. Examples of the o-naphthoquinone diazide sulfonic acids can include, for instance: o-naphthoquinone diazide-4-sulfonic acid, o-naphthoquinone diazide-5-sulfonic acid, and o-naphthoquinone diazide-6-sulfonic acid. Examples of the o-naphthoquinone diazide sulfonic acid halogenide can include, for instance: o-naphthoquinone diazide-4-sulfonyl chloride, o-naphthoquinone diazide-5-sulfonyl chloride, and o-naphthoquinone diazide-6-sulfonyl chloride. The o-naphthoquinone diazide sulfonic acid compound is preferably o-naphthoquinone diazide-4-sulfonyl chloride, o-naphthoquinone diazide-5-sulfonyl chloride, or o-naphthoquinone diazide-6-sulfonyl chloride. Furthermore, the o-naphthoquinone diazide sulfonic acid compound can be used alone or as a mixture of two or more.

The hydroxyl compound is, for instance, a hydroxybenzophenone compound, a hydroxy aryl compound represented by Formula (I) below, a (hydroxyphenyl)hydrocarbon compound represented by Formula (II) below, a fluorene structure-containing aromatic hydroxyl compound represented by Formula (III) below, or other aromatic hydroxyl compounds.

Specific examples of the hydroxybenzophenone compound include, for instance, 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, and 2,3,3',4,4',5'-hexahydroxybenzophenone.

The hydroxy aryl compound has, for instance, a structure represented by Formula (I) below:

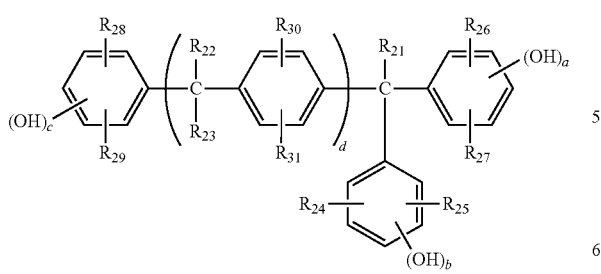

Formula (I)

In Formula (I), $R_{21}$ to $R_{23}$ each represents a hydrogen atom or a lower alkyl group; $R_{24}$ to $R_{29}$ each represents a hydrogen atom, a halogen atom, a lower alkyl group, a lower alkoxy group, a lower alkenyl group, or a cycloalkyl group; $R_{30}$ and $R_{31}$ each represents a hydrogen atom, a halogen atom, or a lower alkyl group; a, b, and c each represents an integer of 1 to 3; and d represents 0 or 1.

In a preferred specific embodiment of the invention, examples of the hydroxy aryl compound represented by Formula (I) above can include, for instance, tris(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene, but are not limited thereto.

The (hydroxyphenyl)hydrocarbon compound has, for instance, a structure represented by Formula (II).

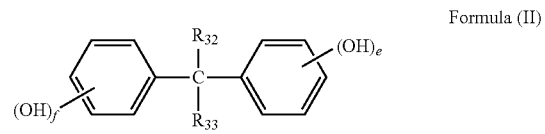

Formula (II)

In Formula (II), $R_{32}$ and $R_{33}$ each represents a hydrogen atom or a lower alkyl group; and e and f represent an integer of 1 to 3.

In a preferred specific embodiment of the invention, the (hydroxyphenyl)hydrocarbon having the structure represented by Formula (II) is 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane, or bis(2,4-dihydroxyphenyl)methane.

The fluorene structure-containing aromatic hydroxyl compound is, for instance, a compound represented by Formula (III).

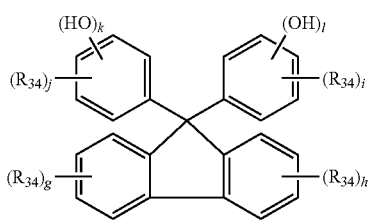

In Formula (III), $R_{34}$ represents hydrogen, an alkyl group, an aryl group, an alkenyl group, or an organic group formed by substituting the above-mentioned group. When a plurality of $R_{34}$ are present, each of $R_{34}$ is respectively the same or different; g, h, i, j are respectively an integer of 0 to 4, and k+1 is an integer of 1 to 6.

By using the ester (C) of an o-naphthoquinone diazide sulfonic acid obtained by reacting an o-naphthoquinone diazide sulfonic acid compound and the compound of Formula (III), the positive photosensitive resin composition of the invention can have better sectional shape.

A commercial product such as BPF (manufactured by JFE Chemical Corporation (Ltd.)), BCF (manufactured by JFE Chemical Corporation (Ltd.)), or Bis-FL (manufactured by Island Chemical Corporation (Ltd.)) can be used as the fluorene structure-containing aromatic hydroxyl compound represented by Formula (III). Furthermore, a compound obtained by reacting a fluorene compound and phenol, catechol, or pyrogallol in the presence of a thioacetic acid and an acid catalyst can also be used.

Specifically, examples of the fluorene structure-containing aromatic hydroxyl compound of Formula (III) can include, for instance:

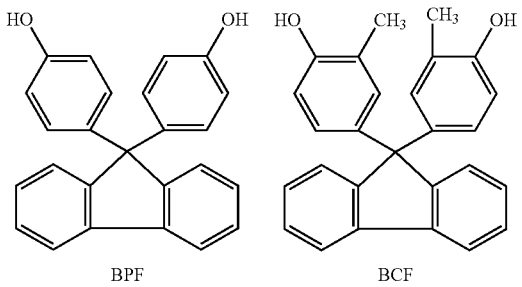

BPF
BisP-FL

BCF

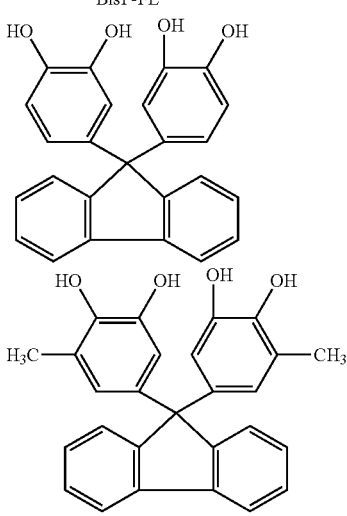

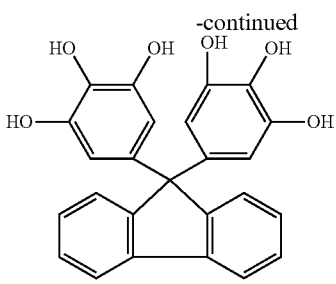

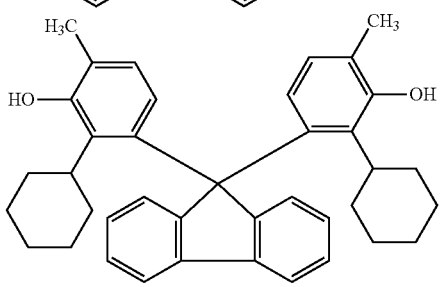

Bis3M6C-FL

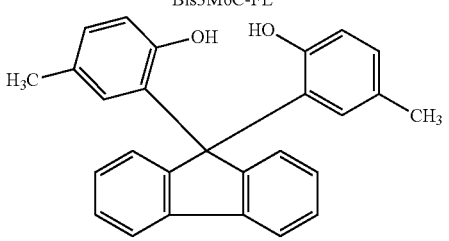

BisPC-FL

Examples of the other aromatic hydroxyl compounds can include, for instance: phenol, p-methoxyphenol, dimethylphenol, quinol, bisphenol A, naphthol, pyrocatechol, pyrogallol monomethyl ether, pyrogallol-1,3-dimethyl ether, gallic acid, partially esterified gallic acid, and partially etherified gallic acid.

The hydroxyl compound is preferably 2,3,4-trihydroxybenzophenone, 2,3,4,4'-tetrahydroxybenzophenone, 1-[1-(4-hydroxyphenyl)isopropyl]-4-[1,1-bis(4-hydroxyphenyl)ethyl]benzene, 2-(2,4-dihydroxyphenyl)-2-(2',4'-dihydroxyphenyl)propane, 9,9'-bis(3,4-dihydroxyphenyl) fluorene, or 9,9'-bis(4-hydroxyphenyl) fluorene (BPF). The hydroxyl compound can be used alone or as a mixture of two or more.

A quinonediazido group-containing compound can be used as the ester (C) of an o-naphthoquinone diazide sulfonic acid in the positive photosensitive resin composition of the invention. The quinonediazido group-containing compound can be, for instance, a compound obtained by performing a condensation reaction on an o-naphthoquinone diazide-4(or 5)-sulfonic acid halogenide and a hydroxyl compound, and then completely esterifying or partially esterifying the resultant. The condensation reaction is generally performed in an organic solvent such as dioxane, N-pyrrolidone, or acetamide, wherein the condensation reaction is preferably performed in the presence of an alkaline condensing agent such as triethanolamine, alkali metal carbonate, or alkali metal bicarbonate.

In a preferred embodiment of the invention, based on a total quantity of 100 mol % of the hydroxyl group in the hydroxyl compound, preferably at least 50 mol %, more preferably at least 60 mol %, of the hydroxyl group is condensed with the o-naphthoquinone diazide sulfonic acid compound to form an ester. That is, the degree of esterification is preferably at least 50%, and more preferably at least 60%.

In a specific embodiment of the invention, based on a usage quantity of 100 parts by weight of the novolac resin (A), the usage quantity of the ester (C) of an o-naphthoquinone diazide sulfonic acid is generally 5 parts by weight to 50 parts by weight, preferably 10 parts by weight to 45 parts by weight, and more preferably 10 parts by weight to 40 parts by weight.

[Solvent (D)]

The solvent (D) used in the invention refers to a solvent that does not react with the organic compositions above, but readily dissolves other organic compositions.

Examples of the solvent (D) include, for instance: a (poly)alkylene glycol monoalkyl ether such as ethylene glycol monomethyl ether, ethylene glycol monoethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, or tripropylene glycol monoethyl ether; a (poly)alkylene glycol monoalkyl ether acetate such as ethylene glycol methyl ether acetate, ethylene glycol ethyl ether acetate, propylene glycol methyl ether acetate (PGMEA for short), or propylene glycol ethyl ether acetate; other ethers such as diethylene glycol dimethyl ether, diethylene glycol methyl ethyl ether, diethylene glycol diethyl ether, or tetrahydrofuran; a ketone such as methyl ethyl ketone, cyclohexanone, 2-heptanone, or 3-heptanone; an alkyl lactate such as methyl lactate or ethyl lactate; other esters such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl glycolate, methyl 2-hydroxy-3-methylbutanoate, 3-methyl-3-methoxy butyl acetate, 3-methyl-3-methoxy butyl propionate, ethyl acetate, n-propyl acetate, isopropyl acetate, n-butyl acetate, isobutyl acetate, n-pentyl acetate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxybutyrate; an aromatic hydrocarbon such as toluene or xylene; and a carboxylic acid amide such as N-methylpyrrolidone, N,N-dimethylformamide, or N,N-dimethylacetamide.

The solvent (D) can be used alone or as a mixture of two or more. The solvent (D) is preferably propylene glycol monoethyl ether, propylene glycol methyl ether acetate, or ethyl lactate.

In a specific embodiment of the invention, based on a usage quantity of 100 parts by weight of the novolac resin (A), the usage quantity of the solvent (D) is generally 100 parts by weight to 1000 parts by weight, preferably 150 parts by weight to 900 parts by weight, and more preferably 200 parts by weight to 800 parts by weight.

[Thermal Acid Generator (E)]

The positive photosensitive resin composition of the invention can further include a thermal acid generator (E), and the thermal acid generator can be used alone or as a mixture of two or more.

The thermal acid generator (E) can contain at least one of a sulfonium salt, a benzothiazolium salt, an ammonium salt, a phosphonium salt, and a sulfonimide compound. In particular, the thermal acid generator (E) preferably contains at least one of a sulfonium salt, a benzothiazolium salt, and a sulfonimide compound.

Specific examples of the sulfonium salt can include, for instance: an alkyl sulfonium salt such as 4-acetophenyl dimethyl sulfonium hexafluoroantimonate, 4-acetoxyphenyl dimethyl sulfonium hexafluoroarsenate, dimethyl-4-(benzyloxycarbonyl) phenyl sulfonium hexafluoroantimonate, dimethyl-4-(benzoyloxy) phenyl sulfonium hexafluoroantimonate, dimethyl-4-(benzoyloxy) phenyl sulfonium hexafluoroarsenate, or dimethyl-3-chloro-4-acetoxy phenyl sulfonium hexafluoroantimonate; a benzyl sulfonium salt such as benzyl-4-hydroxyphenylmethylsulfonium hexafluoroantimonate, benzyl-4-hydroxyphenylmethylsulfonium hexafluorophosphate, 4-acetoxyphenylbenzylmethylsulfonium hexafluoroantimonate, benzyl-4-methoxyphenylmethylsulfonium hexafluoroantimonate, benzyl-2-methyl-4-hydroxyphenylmethylsulfonium hexafluoroantimonate, benzyl-3-chloro-4-hydroxyphenylmethylsulfonium hexafluoroarsenate, or 4-methoxybenzyl-4-hydroxyphenylmethylsulfonium hexafluorophosphate; a dibenzyl sulfonium salt such as dibenzyl-4-hydroxyphenylsulfonium hexafluoro arsenate, dibenzyl-4-hydroxyphenylsulfonium hexafluorophosphate, dibenzyl-4-acetoxyphenylsulfonium hexafluoroantimonate, dibenzyl-4-methoxyphenylsulfonium hexafluoroantimonate, dibenzyl-3-chloro-4-hydroxyphenylsulfonium hexafluoroarsenate, dibenzyl-3-methyl-4-hydroxy-5-tert-butylphenylsulfonium hexafluoroantimonate, or benzyl-4-methoxybenzyl-4-hydroxyphenylsulfonium hexafluorophosphate; and a substituted benzyl sulfonium salt such as 4-chlorobenzyl-4-hydroxyphenylmethylsulfonium hexafluoroantimonate, 4-nitrobenzyl-4-hydroxyphenylmethylsulfonium hexafluoroantimonate, 4-chlorobenzyl-4-hydroxyphenylmethylsulfonium hexafluorophosphate, 4-nitrobenzyl-3-methyl-4-hydroxyphenylmethylsulfonium hexafluoroantimonate, 3,5-dichlorobenzyl-4-hydroxyphenylmethylsulfonium hexafluoroantimonate, or 2-chlorobenzyl-3-chloro-4-hydroxyphenylmethylsulfonium hexafluoroantimonate, but are not limited thereto.

The sulfonium salt compound is preferably, for instance, 4-acetoxyphenyldimethylsulfonium hexafluoroarsenate, benzyl-4-hydroxyphenylmethylsulfonium hexafluoroantimonate, 4-acetoxyphenylbenzylmethylsulfonium hexafluoroantimonate, dibenzyl-4-hydroxyphenylsulfonium hexafluoroantimonate, or dibenzyl-4-acetoxyphenylsulfonium hexafluoroantimonate.

Moreover, specific examples of the benzothiazolium salt can include, for instance: a benzyl benzothiazolium salt such as 3-benzyl benzothiazolium hexafluoroantimonate, 3-benzyl benzothiazolium hexafluorophosphate, 3-benzyl benzothiazolium tetrafluoroborate, 3-(4-methoxybenzyl)benzothiazolium hexafluoroantimonate, 3-benzyl-2-methylthiobenzothiazole hexafluoroantimonate, or 3-benzyl-5-chlorobenzothiazole hexafluoroantimonate. In particular, 3-benzyl benzothiazolium hexafluoroantimonate is preferred.

Examples of the alkyl sulfonium salt compound used in commercial thermal acid generators (E) can include, for instance, Adekaopton CP-66 and Adekaopton CP-77 (both are manufactured by Asahi Denka Chemical Corporation (Ltd.)) Examples of the benzyl sulfonium salt compound can include, for instance, SI-60, SI-80, SI-100, SI-110, SI-145, SI-150, SI-80L, SI-100L, and SI-110L (all are manufactured by Sanshin Chemical Industry Corporation (Ltd.)); and CPI-100P, CPI-101A, CPI-200K, CPI-210S, CPI-410B, CPI-410S, CPI-510B, and CPI-500PG (all are manufactured by SAN-APRO (Ltd.))

Among the commercial products, from the viewpoint of a protective film obtained having a high surface hardness, a product such as Adekaopton CP-77, SI-80, SI-100, SI-110, or CPI-500PG is preferred. The thermal acid generator (E) can be used alone or as a mixture of two or more.

Furthermore, specific examples of the sulfonimide compound can include, for instance: N-(trifluoromethanesulfonyloxy)succinimide, N-(trifluoromethanesulfonyloxy)phthalimide, N-(trifluoromethanesulfonyloxy)diphenylmaleimide, N-(trifluoromethanesulfonyloxy)bicyclo[2.2.1]hept-5-ene-2,3-dicarboximide, N-(trifluoromethylsulfonyloxy)-7-oxabicyclo[2.2.1]hept-5-ene-2,3-dicarboximide, N-(trifluoromethylsulfonyloxy)bicyclo[2.2.1]heptan-5,6-oxy-2,3-dicarboximide, N-(trifluoromethanesulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboximide, N-(10-camphorsulfonyloxy)-7-oxabicyclo[2.2.1]hept-5-ene-2,3-dicarboximide, N-(10-camphorsulfonyloxy)bicyclo[2.2.1]heptan-5,6-oxy-2,3-dicarboximide, N-(10-camphorsulfonyloxy)naphthylimide, N-(p-toluenesulfonyloxy)succinimide, N-(p-toluenesulfonyloxy)phthalimide, N-(p-toluenesulfonyloxy)diphenylmaleimide, N-(p-toluenesulfonyloxy)bicyclo[2.2.1]hept-5-ene-2,3-dicarboximide, N-(p-toluenesulfonyloxy)-7-oxabicyclo[2.2.1]hept-5-ene-2,3-dicarboximide, N-(p-toluenesulfonyloxy)bicyclo[2.2.1]heptane-5,6-oxy-2,3-dicarboximide, N-(p-toluenesulfonyloxy)naphthylimide, N-(2-trifluoromethylbenzenesulfonyloxy)succinimide, N-(2-trifluoromethylbenzenesulfonyloxy)phthalimide, N-(2-trifluoromethylbenzenesulfonyloxy)diphenylmaleimide, N-(2-trifluoromethylbenzenesulfonyloxy)bicyclo[2.2.1]hept-5-ene-2,3-dicarboximide, N-(2-trifluoromethylbenzenesulfonyloxy)-7-oxabicyclo[2.2.1]hept-5-ene-2,3-dicarboximide, N-(2-trifluoromethylbenzenesulfonyloxy)bicyclo[2.2.1]heptan-5,6-oxy-2,3-dicarboximi de, and N-(2-trifluoromethylbenzenesulfonyloxy)naphthylimide; N-(4-trifluoromethylbenzenesulfonyloxy)succinimide, N-(4-trifluoromethylbenzenesulfonyloxy)phthalimide, N-(4-trifluoromethylbenzenesulfonyloxy)diphenylmaleimide, N-(4-trifluoromethylbenzenesulfonyloxy)bicyclo[2.2.1]hept-5-ene-2,3-dicarboximide, N-(4-trifluoromethylbenzenesulfonyloxy)-7-oxabicyclo[2.2.1]hept-5-ene-2,3-dicarboximide, N-(4-trifluoromethylbenzenesulfonyloxy)bicyclo[2.2.1]heptan-5,6-oxy-2,3-dicarboximide, and N-(4-trifluoromethylbenzenesulfonyloxy)naphthylimide; N-(nonafluoro-n-butanesulfonyloxy)succinimide, N-(nonafluoro-n-butanesulfonyloxy)phthalimide, N-(nonafluoro-n-butanesulfonyloxy)diphenylmaleimide, N-(nonafluoro-n-butanesulfonyloxy)bicyclo[2.2.1]hept-5-ene-2,3-dicarboximide, N-(nonafluoro-n-butanesulfonyloxy)-7-oxabicyclo[2.2.1]hept-5-ene-2,3-dicarboximide, N-(nonafluoro-n-butanesulfonyloxy)bicyclo[2.2.1]heptan-5,6-oxy-2,3-dicarboximide, and N-(nonafluoro-n-butanesulfonyloxy)naphthylimide; N-(pentafluorobenzenesulfonyloxy)succinimide, N-(pentafluorobenzenesulfonyloxy)phthalimide, N-(pentafluorobenzenesulfonyloxy)diphenylmaleimide, N-(pentafluorobenzenesulfonyloxy)bicyclo[2.2.1]hept-5-ene-2,3-dicarboximide, N-(pentafluorobenzenesulfonyloxy)-7-oxabicyclo[2.2.1]hept-5-ene-2,3-dicarboximide, N-(pentafluorobenzenesulfonyloxy)bicyclo[2.2.1]heptan-5,6-oxy-2,3-dicarboximide, and N-(pentafluorobenzenesulfonyloxy)naphthylimide; N-(perfluoro-n-octanesulfonyloxy)succinimide, N-(perfluoro-n-octanesulfonyloxy)phthalimide, N-(perfluoro-n-octanesulfonyloxy)diphenylmaleimide, N-(perfluoro-n-octanesulfonyloxy)bicyclo[2.2.1]hept-5-ene-2,3-dicarboximide, N-(perfluoro-n-octanesulfonyloxy)-7-oxabicyclo[2.2.1]hept-5-ene-2,3-dicarboximide, N-(perfluoro-n-octanesulfonyloxy)bicyclo[2.2.1]heptan-5,6-oxy-2,3-dicarboximide, N-(perfluoro-n-octanesulfonyloxy)naphthylimide, and N-{(5-methyl-5-carboxymethanebicyclo[2.2.1]hept-2-yl)sulfonyloxy}succinimide, and the compound can be used alone or as a mixture of two or more.

In a specific embodiment of the invention, based on the usage quantity of 100 parts by weight of the novolac resin (A), the usage quantity of the thermal acid generator (E) is generally 0.01 parts by weight to 0.2 parts by weight, preferably 0.03 parts by weight to 0.18 parts by weight, and more preferably 0.05 parts by weight to 0.15 parts by weight. By using the thermal acid generator (E), the positive photosensitive resin composition of the invention can further display better sectional shape.

[Additive (F)]

The positive photosensitive resin composition of the invention can further contain an additive (F). The additive (F) includes, but is not limited to, an adhesion auxiliary agent, a leveling agent, a diluent, or a sensitizer.

Specific examples of the adhesion auxiliary agent can include, for instance, a melamine compound and a silane compound, but are not limited thereto. The function of the adhesion auxiliary agent is to increase the adhesion between the positive photosensitive resin composition and an adhesive substrate.

Specific examples of the melamine compound can include, for instance: a product such as Cymel-300 or Cymel-303 manufactured by CYTEC Company; and a product such as MW-30MH, MW-30, MS-11, MS-001, MX-750, or MX-706 manufactured by Sanwa Chemical Industry Co., Ltd.

Specific examples of the silane compound can include, for instance: vinyl trimethoxysilane, vinyl triethoxysilane, 3-(meth)acryloyloxypropyl trimethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropyldimethylmethoxysilane, 2-(3,4-epoxycyclohexy)ethyltrimethoxysilane, 3-chloropropylmethyldimethoxysilane, 3-chloropropyltrimethoxysilane, 3-mercaptopropyltrimethoxysilane, and 1,2-bis(trimethoxysilyflethane.

In a specific embodiment of the invention, based on a usage quantity of 100 parts by weight of the novolac resin (A), the usage quantity of the adhesion auxiliary agent of the melamine compound is generally 0 parts by weight to 20 parts by weight, preferably 0.5 parts by weight to 18 parts by weight, and more preferably 1.0 part by weight to 15 parts by weight; the usage quantity of the adhesion auxiliary agent of the silane compound is generally 0 parts by weight to 2 parts by weight, preferably 0.001 parts by weight to 1 part by weight, and more preferably 0.005 parts by weight to 0.8 parts by weight.

Specific examples of the leveling agent can include, for instance, a fluorine-based surfactant and a silicon-based surfactant, but are not limited thereto.

Specific examples of the fluorine-based surfactant can include, for instance: a product such as Flourad FC-430 or FC-431 manufactured by 3M Company; and a product such as F top EF122A, 122B, 122C, 126, or BL20 manufactured by Tochem Product Co., Ltd.

Specific examples of the silicon-based surfactant can include, for instance: a product such as SF8427 or SH29PA manufactured by Dow Corning Toray Silicone.

In a specific embodiment of the invention, based on a usage quantity of 100 parts by weight of the novolac resin (A), the usage quantity of the surfactants is generally 0 parts by weight to 1.2 parts by weight, preferably 0.025 parts by weight to 1.0 part by weight, and more preferably 0.050 parts by weight to 0.8 parts by weight.

Specific examples of the diluent can include, for instance: a product such as RE801 or RE802 manufactured by Empire Ink Mfg. Co., Ltd.

Specific examples of the sensitizer can include, for instance: a product such as TPPA-1000P, TPPA-100-2C, TPPA-1100-3C, TPPA-1100-4C, TPPA-1200-24X, TPPA-1200-26X, TPPA-1300-235T, TPPA-1600-3M6C, or TPPA-MF manufactured by Honshu Chemical Industry Co., Ltd., wherein TPPA-1600-3M6C or TPPA-MF is preferred. The sensitizer can be used alone or as a mixture of two or more.

In a specific embodiment of the invention, based on the usage quantity of 100 parts by weight of the novolac resin (A), the usage quantity of the sensitizer is generally 0 parts by weight to 20 parts by weight, preferably 0.5 parts by weight to 18 parts by weight, and more preferably 1.0 part by weight to 15 parts by weight.

Furthermore, without affecting the performance of the composition of the invention, other additives such as a plasticizer or a stabilizer can further be added in the composition based on actual need.

[Preparation Method of Photosensitive Resin Composition]

The photosensitive resin composition of the invention can be obtained by placing and stirring the novolac resin (A), the alkali-soluble resin (B), the ester (C) of an o-naphthoquinone diazide sulfonic acid, and the solvent (D) in a stirrer to uniformly mix the compositions into a solution state. If needed, the thermal acid generator (E) and/or the additive (F) such as an adhesion auxiliary agent, a leveling agent, a diluent, or a sensitizer can further be added. After the compositions are uniformly mixed, a photosensitive resin composition in a solution state can be obtained.

Moreover, in the positive photosensitive composition of the invention, based on 100 parts by weight of the novolac resin(A), the usage quantity of the alkali-soluble resin (B) is preferably 5 parts by weight to 50 parts by weight, the usage quantity of the ester (C) of an o-naphthoquinone diazide sulfonic acid is preferably 5 parts by weight to 50 parts by weight, and the usage quantity of the solvent (D) is preferably 100 parts by weight to 1000 parts by weight. By controlling the amount of each of the compositions added in the preferred range, the positive photosensitive resin composition obtained has better sectional shape and adhesion in development.

[Pattern Forming Method]

The pattern forming method of the invention includes: coating the positive photosensitive resin composition on a substrate, and performing a pre-bake treatment, an exposure treatment, a developing treatment, and a post-bake treatment in sequence, thereby forming a pattern on the substrate.

More specifically, the positive photosensitive resin composition can be coated on the substrate by a coating method such as spin coating, cast coating, or roll coating. Next, a pre-bake treatment is performed to remove the solvent to form a pre-bake coating film. The conditions for the pre-bake treatment are not particularly limited, and the conditions can be adjusted according to the type and the mixing ratio of each composition. In general, the treatment temperature is preferably between 70° C. and 110° C., and the treatment is performed for 1 minute to 15 minutes.

After the pre-bake treatment, an exposure treatment is performed on the coating film with a specific mask, and the unwanted portion is removed by immersing the coating film in a developing solution at a temperature of 21° C. to 25° C. for about 15 seconds to about 5 minutes to form a specific pattern. The light used in the exposure treatment is preferably an ultraviolet light such as a g-ray, an h-ray, or an i-ray, and the ultraviolet irradiation device can be a(n) (ultra-)high pressure mercury vapor lamp or a metal halide lamp.

Moreover, examples of the developing solution used in the developing treatment can include, for instance: an alkali compound such as sodium hydroxide, potassium hydroxide, sodium carbonate, sodium bicarbonate, potassium carbonate, potassium bicarbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, or 1,8-diazabicyclo[5,4,0]-7-undecene.

The concentration of the developing solution in the positive photosensitive resin composition is preferably 0.001 wt % to 10 wt %, more preferably 0.005 wt % to 5 wt %, and most preferably 0.01 wt % to 1 wt %. Moreover, after the developing treatment is performed with the developing solution of the alkali compound, the coating film is generally washed with water and dried with compressed air or compressed nitrogen.

Then, a post-bake treatment is performed on the coating film by using a heating device such as a hot plate or an oven. The temperature of the post-bake treatment is generally 100° C. to 250° C., wherein the heating time is about 1 minute to 60 minutes if a hot plate is used; and the heating time is about 5 minutes to 90 minutes if an oven is used. After the treatment steps above, a pattern is formed on the substrate.

[Thin Film Transistor Array Substrate]

The thin film transistor array substrate of the invention includes the pattern formed by the pattern forming method.

Specifically, the fabrication method of the thin film transistor array substrate of the invention includes, for instance: coating the positive photosensitive resin composition of the invention on a glass substrate or a plastic substrate containing aluminum, chromium, silicon nitride, or amorphous silicon by a method such as spin coating, cast coating, or roll coating to form a positive photoresist layer. Next, the treatments of, for instance, pre-bake, exposure, development, and post-bake are performed, thereby forming a photosensitive resin pattern. Then, the steps of etching and photoresist removal are performed. The steps are performed repeatedly to produce a thin film transistor array substrate containing a plurality of thin film transistors or electrodes.

FIG. 1 illustrates a partial sectional schematic of a TFT array substrate for a liquid crystal display (LCD) device according to an embodiment of the invention. First, a gate 102a and a storage capacitor Cs electrode 102b are disposed on, for instance, an aluminum thin film on a glass substrate 101. Next, a silicon oxide film ($SiO_x$) 103 or a silicon nitride film ($SiN_x$) 104, etc. is covered on the gate 102a to form an insulation film. An amorphous silicon layer (a-Si) 105 used as a semiconductor active layer is formed on the insulation layer. Then, an amorphous silicon layer 106 doped with a nitrogen impurity can be disposed on the amorphous silicon layer 105 to decrease junction resistance. Thereafter, a drain 107a and a source 107b are formed using a metal such as aluminum, wherein the drain 107a is connected to a data signal line (not shown), and the source 107b is connected to a pixel electrode (or a sub-pixel electrode) 109. Then, a silicon nitride film used as a protective film 108 is disposed to protect, for instance, the amorphous silicon layer 105 used as a semiconductor active layer, the drain 107a, or the source 107b.

[Liquid Crystal Display Device]

The liquid crystal display device of the invention includes the thin film transistor array substrate above.

In addition to the thin film transistor array substrate, the liquid crystal display device of the invention can contain other elements as needed.

In a specific embodiment of the invention, the fabrication method of the liquid crystal display device includes, for instance: placing a spacer between the thin film transistor array substrate (driving substrate) on which a driving device such as a thin film transistor and a pixel electrode (conductive layer) are arranged and a color filter substrate formed by a color filter and a counter electrode (conductive layer), and disposing the thin film transistor array substrate and the color filter substrate opposite to each other. Next, a liquid crystal material is injected into a gap, and then the gap is sealed to form a liquid crystal device. Alternatively, a thin film transistor array substrate having a color filter can be directly formed on the thin film transistor array substrate, such that the thin film transistor array substrate and the counter substrate provided with a counter electrode (conductive layer) are disposed opposite to each other with a spacer in between. Next, a liquid crystal material is injected into a gap, and then the gap is sealed to form a liquid crystal display device. A liquid crystal compound or a liquid crystal composition known to those having ordinary skill in the art can be used as the liquid crystal material, and can be selected based on actual need, and is not particularly limited.

Specific examples of the conductive layer can include, for instance: an indium tin oxide (ITO) thin film; a metal film of, for instance, aluminum, zinc, copper, iron, nickel, chromium, or molybdenum; and a metal oxide film such as silicon dioxide. The conductive layer is preferably a transparent film layer, more preferably an ITO film.

Examples of the substrate used as the thin film transistor array substrate, the color filter substrate, and the counter substrate can include, for instance: a known glass such as soda lime glass, low-expansion glass, alkali-free glass, or quartz glass. Moreover, a substrate formed by a plastic film can also be used.

Hereinafter, the implementation of the invention is further described with embodiments. However, it should be understand that, the embodiments described below only exemplarily describe the fabrication method and the characteristics of the positive photosensitive resin composition of the invention, and are not intended to limit the scope of the invention.

Experimental Examples

Preparation of Positive Photosensitive Resin Composition (1) Preparation of Novolac Resin (A)

First, the novolac resin (A) of each of synthesis examples A-1 to A-4 was prepared according to the conditions in Table 1 below.

Synthesis Example A-1

A nitrogen inlet, a stirrer, a heater, a condenser, and a thermometer were disposed in a four-necked reaction flask with a volume of 1000 mL. After nitrogen gas was introduced into the reaction flask, 0.7 mol of m-cresol, 0.3 mol of p-cresol, 0.65 mol of formaldehyde, and 0.02 mol of oxalic acid were added into the reaction flask. Next, the reaction flask was slowly stirred such that the temperature of the reaction solution increased to 100° C., and a polycondensation was performed at this temperature for about 6 hours. Then, the temperature of the reaction solution was increased to 180° C., and the reaction solution was dried at a reduced pressure of 10 mmHg. After the solvent was removed, a novolac resin A-1 was obtained.

Synthesis Examples A-2 to A-4

In addition to changing the type and the weight ratio of each of the reaction materials added, and the reaction temperature, the novolac resins of synthesis examples A-2 to A-4 were prepared with the same method as the synthesis example A-1. The compounds added and the weight ratios of each synthesis example are shown in Table 1.

TABLE 1

| | synthesis examples of novolac resin (A) | | | | | | | |
|---|---|---|---|---|---|---|---|---|
| | Composition (moles) | | | | | | reaction | time of |
| Preparation | aromatic hydroxyl compound | | | | aldehyde | catalyst | temperature | polycondensation |
| example | o-cresol | m-cresol | p-cresol | 2,5-xylenol | formaldehyde | oxalic acid | (° C.) | (hours) |
| A-1 | | 0.70 | 0.30 | | 0.65 | 0.020 | 100 | 6 |
| A-2 | 0.05 | 0.30 | 0.65 | | 0.80 | 0.015 | 95 | 6 |
| A-3 | | 0.35 | 0.60 | 0.05 | 0.70 | 0.020 | 100 | 6 |
| A-4 | 0.05 | 0.30 | 0.60 | 0.05 | 0.75 | 0.020 | 100 | 6 |

(2) Preparation of Alkali-Soluble Resin (B)

Synthesis Example B-1-1

100 parts by weight of a fluorene epoxy compound (Model No. ESF-300, manufactured by Nippon Steel Chemical Co.; epoxy equivalent 231), 30 parts by weight of acrylic acid, 0.3 parts by weight of benzyltriethylammonium chloride, 0.1 parts by weight of 2,6-di-tert-butyl-p-cresol, and 130 parts by weight of propylene glycol methyl ether acetate were continuously added into a 500 mL four-necked flask, and the feeding speed was controlled at 25 parts by weight/minute. The temperature of the reaction process was maintained at 100° C. to 110° C. After 15 hours of reaction, a light yellow transparent mixture solution with a solid content of 50 wt % was obtained.

Then, 100 parts by weight of the light yellow transparent mixture solution was dissolved in 25 parts by weight of ethylene glycol ethyl ether acetate, and 6 parts by weight of tetrahydrophthalic anhydride and 13 parts by weight of benzophenone tetracarboxylic dianhydride were added at the same time. Next, the mixture was heated to 110° C. to 115° C. to perform a reaction. After 2 hours of reaction, a resin having an unsaturated group (hereinafter resin (B-1-1)) and an acid value of 98.0 mgKOH/g was obtained.

Synthesis Example B-1-2

100 parts by weight of a fluorene epoxy compound (Model No. ESF-300, manufactured by Nippon Steel Chemical Co.; epoxy equivalent 231), 30 parts by weight of acrylic acid, 0.3 parts by weight of benzyltriethylammonium chloride, 0.1 parts by weight of 2,6-di-tert-butyl-p-cresol, and 130 parts by weight of propylene glycol methyl ether acetate were added continuously into a 500 mL four-necked flask, and the feeding speed was controlled at 25 parts by weight/minute. The temperature of the reaction process was maintained at 100° C. to 110° C. After 15 hours of reaction, a light yellow transparent mixture solution with a solid content of 50 wt % was obtained.

Then, 100 parts by weight of the light yellow transparent mixture solution obtained was dissolved in 25 parts by weight of ethylene glycol ethyl ether acetate, and 13 parts by weight of benzophenone tetracarboxylic dianhydride was added to react at 90° C. to 95° C. for 2 hours. Then, 6 parts by weight of tetrahydrophthalic anhydride was added to the mixture, and the mixture was reacted at 90° C. to 95° C. for 4 hours to obtain a resin having an unsaturated group and an acid value of 99.0 mgKOH/g (hereinafter resin (B-1-2)).

Synthesis Example B-1-3

400 parts by weight of a fluorene epoxy compound (Model No. NC-3000, manufactured by Nippon Kayaku (Co., Ltd.); epoxy equivalent 288), 102 parts by weight of acrylic acid, 0.3 parts by weight of p-methoxyphenol, 5 parts by weight of triphenylphosphine, and 264 parts by weight of propylene glycol methyl ether acetate were placed in a reaction flask. The temperature was maintained at 95° C. during the reaction process, and after 9 hours of reaction, an intermediate product with an acid value of 2.2 mgKOH/g was obtained. Then, 151 parts by weight of tetrahydrophthalic anhydride was added to the mixture, and the mixture was reacted at 95° C. for 4 hours to obtain a resin having an unsaturated group (hereinafter resin (B-1-3)), an acid value of 102 mgKOH/g and a weight average molecular weight of 3,200.

Synthesis Example B-2-1

1 part by weight of 2,2'-azobisisobutyronitrile, 240 parts by weight of propylene glycol methyl ether acetate, 20 parts by weight of methacrylic acid, 15 parts by weight of styrene, 35 parts by weight of benzylmethacrylate, 10 parts by weight of glycidyl methacrylate, and 20 parts by weight of N-phenyl maleimide were placed into a round-bottom flask equipped with a stirrer and a condenser, and the interior of the flask was filled with nitrogen gas. Thereafter, the flask was slowly stirred and the temperature was increased to 80° C. to uniformly mix each reactant and to perform a polymerization reaction for 4 hours. Then, the flask was heated to 100° C., and 0.5 parts by weight of 2,2'-azobisisobutyronitrile was added to perform a polymerization reaction for 1 hour to obtain an alkali-soluble resin (hereinafter resin (B-2-1)).

Synthesis Example B-2-2

2 part by weight of 2,2'-azobisisobutyronitrile, 300 parts by weight of dipropylene glycol methyl ether, 15 parts by weight of methacrylic acid, 15 parts by weight of 2-hydroxyethyl acrylate, and 70 parts by weight of benzyl methacrylate were placed into a round-bottom flask equipped with a stirrer and a condenser, and the interior of the flask was filled with nitrogen gas. Thereafter, the flask was slowly stirred and the temperature was increased to 80° C. to uniformly mix each reactant and to perform a polymerization reaction for 3 hours. Then, the flask was heated to 100° C., and 0.5 parts by weight of 2,2'-azobisisobutyronitrile was added to perform a polymerization reaction for 1 hour to obtain an alkali-soluble resin (hereinafter resin (B-2-2)).

After each composition was prepared, the positive photosensitive resin compositions of example 1 to example 8 and comparative example 1 to comparative example 4 were prepared according to the preparation method of the photosensitive resin composition described above and the conditions of Table 2 below.

In Table 2, resin (A-1) to resin (A-4) are respectively the novolac resins obtained in synthesis example A-1 to synthesis example A-4; resin (B-1-1) to resin (B-1-3) are respectively the resins with an unsaturated group obtained in synthesis example B-1-1 to synthesis example B-1-3; resin (B-2-1) and resin (B-2-2) are respectively the alkali-soluble resins obtained in synthesis example B-2-1 and synthesis example B-2-2; ester (C-1) is an ester of 2,3,4-trihydroxy benzophenone and 1,2-naphthoquinone diazide-5-sulfonic acid; ester (C-2) is an ester of 2,3, 4,4'-tetrahydroxy benzophenone and 1,2-naphthoquinone diazide-5-sulfonic acid; ester (C-3) is an ester of 1-[1-(4-hydroxyphenyl)isopropyl]-4-[1,1-bis(4-hydroxyphenyl)ethyl]benzene and 1,2-naphthoquinone diazide-5-sulfonic acid; ester (C-4) is an ester of 2-(2,4-dihydroxyphenyl)-2-(2',4'-dihydroxyphenyl)propane and 1,2-naphthoquinone diazide-5-sulfonic acid; ester (C-5) is an ester of 9,9'-bis(3,4-dihydroxyphenyl)fluorene and 1,2-naphthoquinone diazide-5-sulfonic acid; ester (C-6) is an ester of 9,9'-bis(4-hydroxyphenyl)fluorene and 1,2-naphthoquinone diazide-5-sulfonic acid; solvent (D-1) is propylene glycol monomethyl ether acetate (PGMEA); solvent (D-2) is ethyl lactate (EL); solvent (D-3) is propylene glycol monoethyl ether (PGEE); thermal acid generator (E-1) is Adekaopton CP-77 (manufactured by Asahi Denka Kogyo (Ltd.)); thermal acid generator (E-2) is SI-100 (manufactured by Sanshin Chemical Industry (Ltd.)); thermal acid generator (E-3) is CPI-500PG (manufactured by SAN-APRO (Ltd.)); additive (F-1) is a surfactant (product name SF8427; manufactured by Dow Corning Toray Silicone Co., Ltd.); and additive (F-2) is an adhesion auxiliary agent (product name Cymel-303; manufactured by CYTEC Co., Ltd.)

After the positive photosensitive resin composition of each example and comparative example was prepared, the sectional shape and the adhesion in development of each composition were evaluated according to the methods below.

<Evaluation Methods>

(A) Test of Sectional Shape

The positive photosensitive resin composition of each example and comparative example was coated on a plain glass substrate (100 mm×100 mm×0.7 mm) by spin coating, and was pre-baked at 100° C. for 120 seconds to obtain a pre-bake coating film with a thickness of 3 μm. The pre-bake coating film was irradiated with 150 mJ/cm² of ultraviolet light (model number of exposure machine. AG500-4N; manufactured by M&R Nano Technology Co., Ltd.) via a photomask of line and space (manufactured by Filcon Co., Ltd., Japan), and then the pre-bake coating film was developed at 23° C. for 1 minute with a 2.38% TMAH aqueous solution as a developing agent to remove the exposed portion of the coating film on the substrate. Then, the coating film was washed with pure water and a post-bake treatment was performed on the coating film at different post-bake temperatures for 2 minutes to obtain a plain glass substrate having a pattern. Next, an SEM micrograph of the coating film was taken and the sectional shape thereof was observed. A vertical shape (▮) or a tapering shape (▲) is preferred. Specifically, the evaluation standards of the sectional shape are as follows:

◎: post-bake temperature >130° C.

○: 130° C.≥post-bake temperature >120° C.

X: 120° C.≥post-bake temperature, or a vertical shape or a tapering shape was not observed at this temperature (B) Test of Adhesion in Development The positive photosensitive resin composition of each example and comparative example was coated on a plain glass substrate (100 mm×100 mm×0.7 mm) by a method of spin-coating, and was pre-baked at 100° C. for 120 seconds to obtain a pre-bake coating film with a thickness of 3 μm. The pre-bake coating film was irradiated with 150 mJ/cm² of ultraviolet light (model number of exposure machine: AG500-4N; manufactured by M&R Nano Technology Co., Ltd.) via a photomask having a specific pattern, and then the pre-bake coating film was developed at 23° C. for 1 minute with a 2.38% TMAH aqueous solution as a developing agent to remove the exposed portion of the coating film on the substrate. Next, the minimum line width of the pattern formed was confirmed. Specifically, the evaluation standards of the adhesion in development are as follows:

○: the minimum line width≤10 μm

Δ: 15 μm> the minimum line width >10 μm

X: the minimum line width >15 μm

The evaluation results of the positive photosensitive resin composition of each example and comparative example are shown in Table 2.

TABLE 2

| Composition | | Example | | | | | | | | Comparative example | | | |
|---|---|---|---|---|---|---|---|---|---|---|---|---|---|
| | | 1 | 2 | 3 | 4 | 5 | 6 | 7 | 8 | 1 | 2 | 3 | 4 |
| novolac resin (A) (parts by weight) | A-1 | 100 | | | | 100 | 30 | | 70 | | | | |
| | A-2 | | 100 | | | | 70 | 50 | | | 100 | | |
| | A-3 | | | 100 | | | | 50 | | | | | 100 |
| | A-4 | | | | 100 | | | | 30 | | | | |
| alkali-soluble resin (B) (parts by weight) | B-1-1 | 5 | | | | 20 | | 30 | | 100 | | | |
| | B-1-2 | | 10 | | 20 | | 40 | 20 | 15 | | 100 | | |
| | B-1-3 | | | 15 | | 10 | | | | | | | |
| | B-2-1 | | | | | | | | 5 | | 20 | | 10 |
| | B-2-2 | | | | | | | | | | | 20 | |
| ester (C) of an o-naphthoquinone diazide sulfonic acid (parts by weight) | C-1 | 5 | | | | 20 | | | | 25 | | | 20 |
| | C-2 | | 10 | 15 | | 20 | | 5 | | | 25 | | |
| | C-3 | | | 5 | | | | | | | | 20 | |
| | C-4 | | | | | | | | 30 | | | | |
| | C-5 | | | | 30 | | | | | | | | |
| | C-6 | | | | | | 50 | 20 | | | | | |
| solvent (D) (parts by weight) | D-1 | 100 | 300 | 300 | | 500 | 1000 | | | 500 | | | 500 |
| | D-2 | | 200 | | 500 | | | 500 | | | 500 | | |
| | D-3 | | | | | 300 | | | 500 | | | 500 | |
| thermal acid generator (E) (parts by weight) | E-1 | | | | 0.05 | | | | | | | | |
| | E-2 | | | | | | | 0.2 | | | | | |
| | E-3 | | | 0.01 | | | | | | | | | |
| additive (F) (parts by weight) | F-1 | | | | 0.1 | | | | | | | | |
| | F-2 | | | | | | 0.3 | | | | | | |
| test item | sectional shape | ○ | ◎ | ◎ | ◎ | ○ | ◎ | ◎ | ◎ | X | X | X | X |
| | adhesion in development | ○ | ○ | ○ | ○ | ○ | ○ | ○ | ○ | X | X | X | X |

The results in Table 2 show that, compared to comparative examples 1-4, the positive photosensitive resin composition of each of examples 1-8 is significantly better in sectional shape and adhesion in development, wherein the evaluations of the positive photosensitive resin compositions of examples 2-4 and examples 6 and 7 are the best.

Moreover, as shown in Table 2, only the novolac resin (A) or the alkali-soluble resin (B) is added in the compositions of comparative examples 1-4. After comparing the results of examples 1-8 and comparative examples 1-4, it is noted that if the novolac resin (A) and the alkali-soluble resin (B) are not simultaneously contained in the photosensitive resin composition, then issues of poor sectional shape and adhesion in development are present. That is, when the novolac resin (A) or the alkali-soluble resin (B) is not used at all; neither sectional shape nor adhesion in development is improved.

Accordingly, adding the novolac resin (A) and the alkali-soluble resin (B) can effectively and significantly improve the sectional shape and the adhesion in development of the positive photosensitive resin composition.

In summary, the positive photosensitive resin composition provided in the invention is good in aspects such as sectional shape and adhesion in development, and is suitable for use in the pattern forming method. By containing the pattern obtained from the positive photosensitive resin composition, a thin film transistor array substrate and a liquid crystal display device for which an aspect such as display properties is further improved can also be produced.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A positive photosensitive resin composition, comprising:
   a novolac resin (A);
   an alkali-soluble resin (B);
   an ester (C) of an o-naphthoquinone diazide sulfonic acid; and
   a solvent (D);
   wherein the alkali-soluble resin (B) contains a first alkali-soluble resin (B-1), the first alkali-soluble resin (B-1) is produced by performing a polymerization on a mixture; the mixture contains an epoxy compound (i) and a compound (ii), the epoxy compound (i) has at least two epoxy groups, and the compound (ii) has at least one carboxylic acid group and at least one ethylenically unsaturated group, wherein the epoxy compound (i) has a structure represented by Formula (i-1) or Formula (i-2) below:

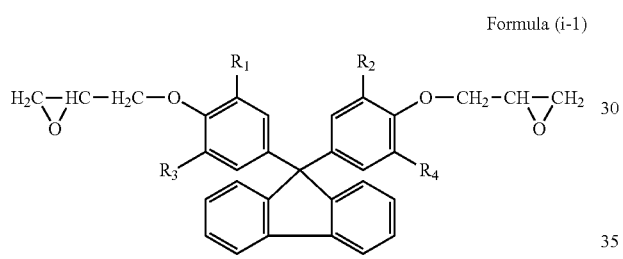

Formula (i-1)

in Formula (1), $R_1$, $R_2$, $R_3$, and $R_4$ are respectively the same or different and each represents a hydrogen atom, a halogen atom, an alkyl group having 1 to 5 carbons, an alkoxy group having 1 to 5 carbons, an aryl group having 6 to 12 carbons, or an aralkyl group having 6 to 12 carbons;

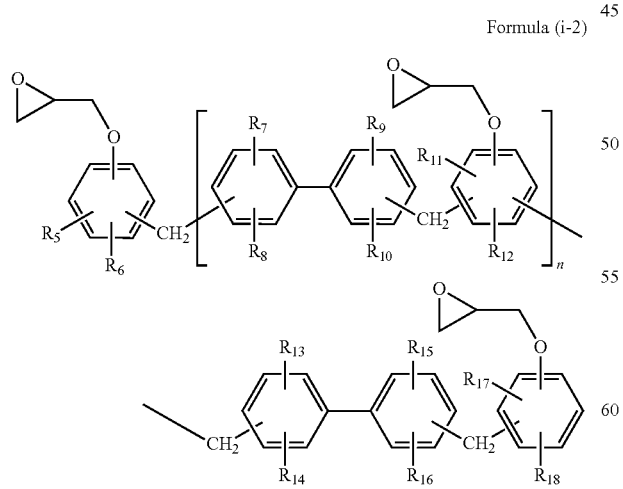

Formula (i-2)

in Formula (i-2), $R_5$ to $R_{18}$ are respectively the same or different and each represents a hydrogen atom, a halogen atom, an alkyl group having 1 to 8 carbons, or an aromatic group having 6 to 15 carbons, and n represents an integer of 0 to 10.

2. The positive photosensitive resin composition of claim 1, wherein the ester (C) of an o-naphthoquinone diazide sulfonic acid is an ester of an o-naphthoquinone diazide sulfonic acid compound and a compound of the following Formula (III):

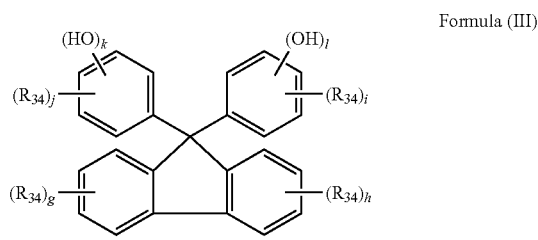

Formula (III)

in Formula (III), $R_{34}$ represents hydrogen, an alkyl group, an aryl group, an alkenyl group, or an organic group formed by substituting the above-mentioned group; when a plurality of $R_{34}$ are present, each of $R_{34}$ is respectively the same or different; g, h, i, j are respectively an integer of 0 to 4, and k+l is an integer of 1 to 6.

3. The positive photosensitive resin composition of claim 1, wherein based on 100 parts by weight of the novolac resin (A), a usage quantity of the alkali-soluble resin (B) is 5 parts by weight to 50 parts by weight, a usage quantity of the ester (C) of an o-naphthoquinone diazide sulfonic acid is 5 parts by weight to 50 parts by weight, and a usage quantity of the solvent (D) is 100 parts by weight to 1000 parts by weight; and based on a usage quantity of 100 parts by weight of the alkali-soluble resin (B), a usage quantity of the first alkali-soluble resin (B-1) is 30 parts by weight to 100 parts by weight.

4. The positive photosensitive resin composition of claim 1, further comprising a thermal acid generator (E), and the thermal acid generator (E) contains at least one of a sulfonium salt, a benzothiazolium salt, and a sulfonimide compound.

5. The positive photosensitive resin composition of claim 4, wherein based on 100 parts by weight of the novolac resin (A), a usage quantity of the thermal acid generator (E) is 0.01 parts by weight to 0.2 parts by weight.

6. A pattern forming method, comprising:
   coating the positive photosensitive resin composition of claim 1 on a substrate, and performing a pre-bake treatment, an exposure treatment, a development treatment, and a post-bake treatment in sequence, thereby forming a pattern on the substrate.

* * * * *